(12) United States Patent
Zhou

(10) Patent No.: US 12,284,792 B2
(45) Date of Patent: Apr. 22, 2025

(54) POWER ELECTRONICS ASSEMBLIES HAVING POWER ELECTRONICS DEVICES EMBEDDED WITHIN A FLIP CHIP

(71) Applicant: Toyota Motor Engineering & Manufacturing North America, Inc., Plano, TX (US)

(72) Inventor: Feng Zhou, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 275 days.

(21) Appl. No.: 18/173,231

(22) Filed: Feb. 23, 2023

(65) Prior Publication Data

US 2024/0292576 A1    Aug. 29, 2024

(51) Int. Cl.
*H05K 7/20* (2006.01)
*H05K 1/02* (2006.01)
*H05K 1/18* (2006.01)

(52) U.S. Cl.
CPC ....... *H05K 7/20927* (2013.01); *H05K 1/0206* (2013.01); *H05K 1/183* (2013.01); *H05K 7/20254* (2013.01); *H05K 2201/064* (2013.01)

(58) Field of Classification Search
CPC .. H05K 7/205; H05K 7/20254; H05K 7/2039; H05K 7/20509; H05K 7/209; H05K 7/20927; H05K 1/0203; H05K 1/0204; H05K 1/0207; H05K 1/0209; H05K 2201/064; H05K 2201/066; H05K 2201/10166; H05K 2201/10515; H01L 23/3121; H01L 23/367; H01L 23/3675; H01L 23/3735; H01L 23/4006; H01L 23/49827; H01L 23/5384; H01L 23/5389; H01L 25/0655; H01L 2023/4087; H01L 2924/15153; H01L 2924/1517; H01L 2924/15793

See application file for complete search history.

(56) References Cited

U.S. PATENT DOCUMENTS

| 6,191,478 | B1 | 2/2001 | Chen |
| 8,942,004 | B2 | 1/2015 | Hong et al. |
| 10,177,064 | B2 | 1/2019 | Anderson et al. |

(Continued)

FOREIGN PATENT DOCUMENTS

CN    114122242 B    5/2022

*Primary Examiner* — Amir A Jalali
(74) *Attorney, Agent, or Firm* — Dinsmore & Shohl LLP

(57) ABSTRACT

A power electronics assembly including a circuit board assembly including a plurality of electrically conductive logic layers, a plurality of electrically conductive power layers, and a laminate panel provided between the plurality of electrically conductive logic layers and the plurality of electrically conductive logic layers. The laminate panel includes a power electronics device assembly including a substrate and a power electronics device. The substrate includes a graphite layer and a metal layer encasing the graphite layer. A recess is formed in an outer surface of the metal layer. The power electronics device is bonded within the recess of the outer surface of the substrate. Each electrically conductive logic layer is provided at a first surface of the laminate panel, and each electrically conductive power layer is provided at a second surface of the laminate panel opposite the first surface of the laminate panel.

20 Claims, 6 Drawing Sheets

(56) References Cited

U.S. PATENT DOCUMENTS

| | | | |
|---|---|---|---|
| 11,177,193 B2 | 11/2021 | Shen | |
| 2011/0290540 A1* | 12/2011 | Jung | H01L 23/13 |
| | | | 174/258 |
| 2022/0141951 A1* | 5/2022 | Zhou | H05K 1/185 |
| | | | 361/700 |
| 2024/0014142 A1* | 1/2024 | Morianz | H01L 24/82 |
| 2024/0038624 A1* | 2/2024 | Zhou | H01L 23/3735 |
| 2024/0130093 A1* | 4/2024 | Zhou | H05K 1/0204 |
| 2024/0244805 A1* | 7/2024 | Zhou | H02M 7/003 |

* cited by examiner

POWER ELECTRONICS ASSEMBLIES HAVING POWER ELECTRONICS DEVICES EMBEDDED WITHIN A FLIP CHIP

TECHNICAL FIELD

The present specification generally relates to power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronics device of a power electronics assembly that may be used as a switch in an inverter. Power electronics devices have large cooling requirements due to the heat generated.

Additionally, conventional power electronics assemblies include a plurality of layers formed from different materials, which results in different expansion rates at an interface of each of the layers. As such, the same number of layers may be provided on each side of the power electronics device to reduce accumulating stresses and alleviate bowing. However, this may require additional layers that would otherwise be unnecessary, thus increasing a total footprint of the power electronics assemblies. For these reasons, and more, there is a need to improve the cooling of power electronics devices while maintaining a compact package size.

SUMMARY

In one embodiment, a power electronics assembly includes: a circuit board assembly including: a plurality of electrically conductive logic layers; a plurality of electrically conductive power layers; and a laminate panel provided between the plurality of electrically conductive logic layers and the plurality of electrically conductive power layers. The laminate panel includes: a power electronics device assembly including: a substrate; and a power electronics device. The substrate includes: a graphite layer; and a metal layer encasing the graphite layer, a recess formed in an outer surface of the metal layer. The power electronics device is bonded within the recess of the outer surface of the substrate. Each electrically conductive logic layer is provided at a first surface of the laminate panel, and each electrically conductive power layer is provided at a second surface of the laminate panel opposite the first surface of the laminate panel.

In another embodiment, a power electronics assembly includes: a circuit board assembly including: a plurality of electrically conductive logic layers; a plurality of electrically conductive power layers; a laminate panel provided between the plurality of electrically conductive logic layers and the plurality of electrically conductive power layers; and a cold plate. The circuit board assembly is mounted to a surface of the cold plate. The laminate panel includes: a power electronics device assembly including: a substrate; and a power electronics device. The substrate includes: a graphite layer; and a metal layer encasing the graphite layer, a recess formed in an outer surface of the metal layer. The power electronics device is bonded within the recess of the outer surface of the substrate. A plurality of vias thermally couple each of the power electronics devices to the plurality of electrically conductive logic layers and the plurality of electrically conductive power layers. Each electrically conductive logic layer is provided at a first surface of the laminate panel, and each electrically conductive power layer is provided at a second surface of the laminate panel opposite the first surface of the laminate panel.

In yet another embodiment, a method includes: providing a first electrically insulating layer on a first surface of a cold plate; and providing a circuit board assembly on the first electrically insulating layer opposite the cold plate. The circuit board assembly includes: a plurality of electrically conductive logic layers; a plurality of electrically conductive power layers; and a laminate panel provided between the plurality of electrically conductive logic layers and the plurality of electrically conductive power layers. The laminate panel includes: a power electronics device assembly comprising: a substrate; and a power electronics device. The substrate includes: a graphite layer; and a metal layer encasing the graphite layer, a recess formed in an outer surface of the metal layer. The power electronics device is bonded within the recess of the outer surface of the substrate. Each electrically conductive logic layer is provided at a first surface of the laminate panel, and each electrically conductive power layer is provided at a second surface of the laminate panel opposite the first surface of the laminate panel.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
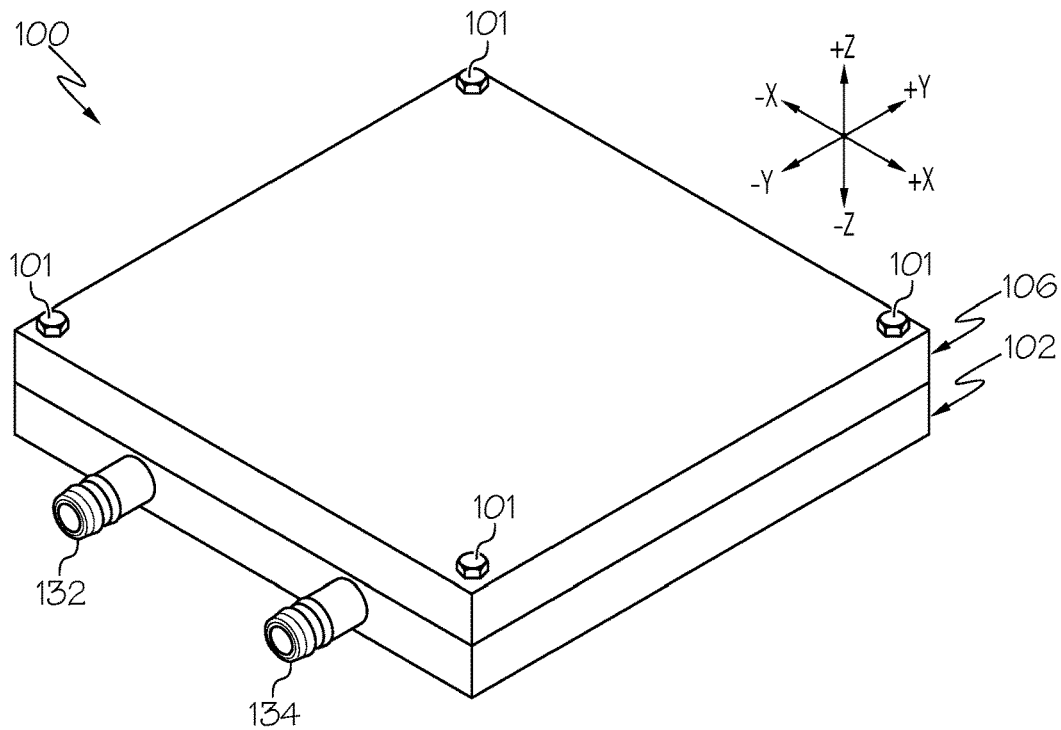
FIG. 1 schematically depicts an assembled perspective view of a power electronics assembly including a cold plate and a circuit board assembly, according to one or more embodiments described and illustrated herein.

Embodiments described herein are generally directed to power electronics assemblies having a circuit board assembly coupled to a cold plate. The circuit board assembly includes a flipped power electronics device assembly, which may be referred to herein as a flip chip, including a substrate. A power electronics device may be embedded within the substrate. As discussed herein, the flipped orientation of the power electronics device assembly positions the power electronics device embedded within the substrate to be directed toward the cold plate rather than facing a direction opposite the cold plate.

The power electronics device assemblies of the present disclosure comprise a power electronics device affixed to a substrate. As described in more detail below, the substrate includes a graphite layer that provides enhanced heat spreading capabilities. Further, embodiments of the present disclosure include one or more electrical insulating layers that electrically isolate the power electronics device(s) from a cold plate. For example, an electrically insulating layer of the substrate enables the removal of an electrical insulation layer between the printed circuit board and the cold plate because the electrical isolation is provided by the substrate itself.

As described in more detail below, the substrates of the present disclosure provide enhanced thermal properties due to graphite layers that promote heat flux flow toward a cold plate. The substrates described herein include stacked metal, graphite, and one or more electrically insulating layers in a compact package. The bonding materials described herein for bonding the substrates are particularly adapted for increased thermal conductivity relative to other bonding technologies, while also maintaining an ability of electrically insulate the substrates. The devices, systems, and apparatuses described herein improves the heat flux from the substrate to the cold plate, thereby increasing heat spreading and cooling performance for the circuit board assembly.

The cold plates, power electronics device assemblies, circuit board assemblies, power electronics assemblies, and the like described herein may be used in electrified vehicles, such as and without being limited to, an electric vehicle, a hybrid electric vehicle, any electric motor, generators, industrial tools, household appliances, and the like. The various assemblies described herein may be electrically coupled to an electric motor and/or a battery, and may be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, a "substrate" is a mounting substrate operable to be affixed to a power electronics device and includes one or more of a metal layer, a graphite layer, and an electrically insulating layer.

Various embodiments of power electronics assemblies, power electronics device assemblies, and cold plates are described in detail below. Whenever possible, the same reference numerals will be used throughout the drawings to refer to the same or like parts.

Figure 2:
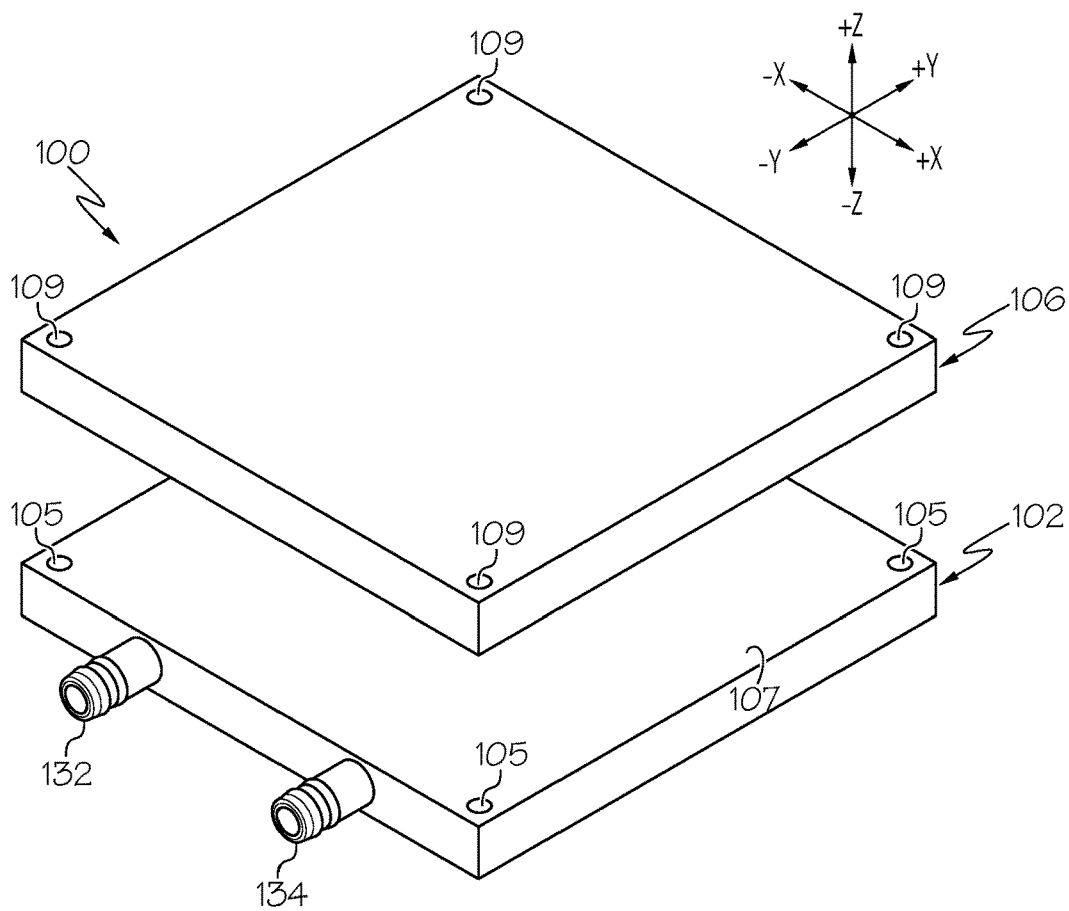
FIG. 2 schematically depicts an exploded perspective view of the power electronics assembly of FIG. 1, according to one or more embodiments described and illustrated herein.

Referring now to FIGS. 1 and 2, an example power electronics assembly 100 is generally illustrated in an assembled view and an exploded view, respectively. The power electronics assembly 100 illustrated in FIGS. 1 and 2 includes a cold plate 102 and a circuit board assembly 106. The cold plate 102 may be any device capable of removing heat flux from the power electronics devices 140 (see FIG. 4) coupled to a substrate material of the circuit board assembly 106. Non-limiting examples for the cold plate 102 include heat sinks, single-phase liquid cooling, two-phase liquid cooling, and vapor chambers. FIGS. 1 and 2 illustrate the cold plate 102 has being configured as a single-phase liquid cooling device. The cold plate 102 includes a fluid inlet 132 and a fluid outlet 134 fluidly coupled to a fluid chamber 115 (FIG. 12) within the cold plate 102. While FIGS. 1 and 2 depict the fluid inlet 132 and the fluid outlet 134 as being on the same side of the cold plate 102, the present disclosure is not limited to such an embodiment. That is, in other embodiments, the fluid inlet 132 and the fluid outlet 134 may be positioned on other surfaces.

Referring again to FIGS. 1 and 2, the circuit board assembly 106 is coupled (e.g., affixed) to a first surface 107 of the cold plate 102. FIGS. 1 and 2 illustrate the circuit board assembly 106 as being affixed to the first surface 107 of the cold plate 102 by way of fasteners 101 (e.g., bolts and nuts) extending through through-holes 105 of the cold plate 102 and through-holes 109 of the circuit board assembly 106. It should be appreciated that, in other embodiments, the through-holes 105, 109 and fasteners 101 may be omitted, as described below.

In embodiments, the circuit board assembly 106 may be 3D printed layers. It should be appreciated that in such embodiments, the 3D printed layers of the circuit board assembly 106 reduce overall thermal resistance. In embodiments, the circuit board assembly 106 may be laminated to the cold plate 102. However, other additive manufacturing processes for affixing the circuit board assembly 106 to the cold plate 102 are also contemplated and included within the scope of the present disclosure. In addition, as described in more detail herein, via connections or vias may be made between the various components of the circuit board assembly 106 and the power electronics devices 140 (FIG. 4) using laser drilling. That is, the vias are drilled through the circuit board assembly 106 to the top surface of each conductive layer and the power electronics devices 140. As described in more detail herein, the vias are then filled with copper via an electroplating method to establish electrical connections between components. Although the circuit board assembly 106 is generally depicted in FIGS. 1 and 2, the individual layers and various steps of assembly are depicted in FIGS. 7-12.

Figure 3:
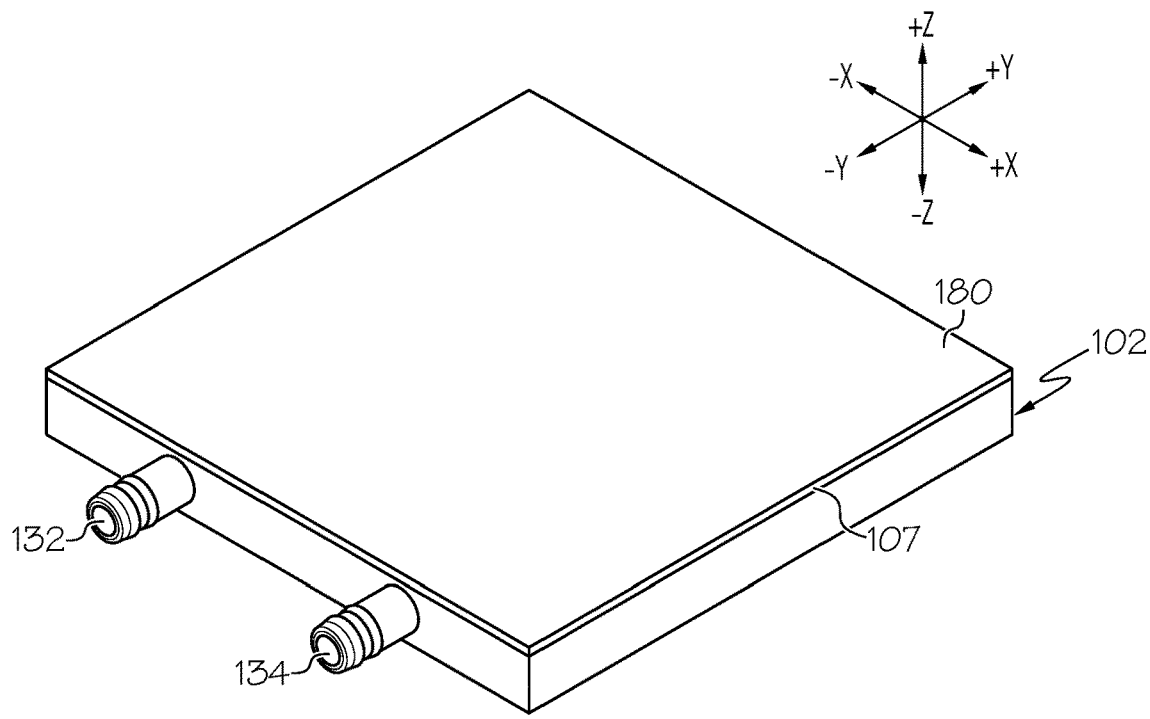
FIG. 3 schematically depicts a partial perspective view of the cold plate of the power electronics assembly of FIG. 1, according to one or more embodiments described and illustrated herein.

Referring now to FIGS. 3-12, the individual steps of manufacturing the power electronics assembly 100 is depicted. As shown in FIG. 3, a first electrically insulating layer 180 is shown deposited onto the first surface 107 of the cold plate 102 to lower the thermal resistance between the circuit board assembly 106 (FIG. 1) and the cold plate 102. The first electrically insulating layer 180 may generally be any layer that provides electrical insulation, such as ceramic or the like. In embodiments, the first electrically insulating layer 180 includes an insulation metal substrate (IMS) dielectric film. The IMS dielectric film may be a solid film layer. In other embodiments, the first electrically insulating layer 180 may be a thermal grease layer. It is noted that the first electrically insulating layer 180 may not have dedicated through-holes.

Figure 4:
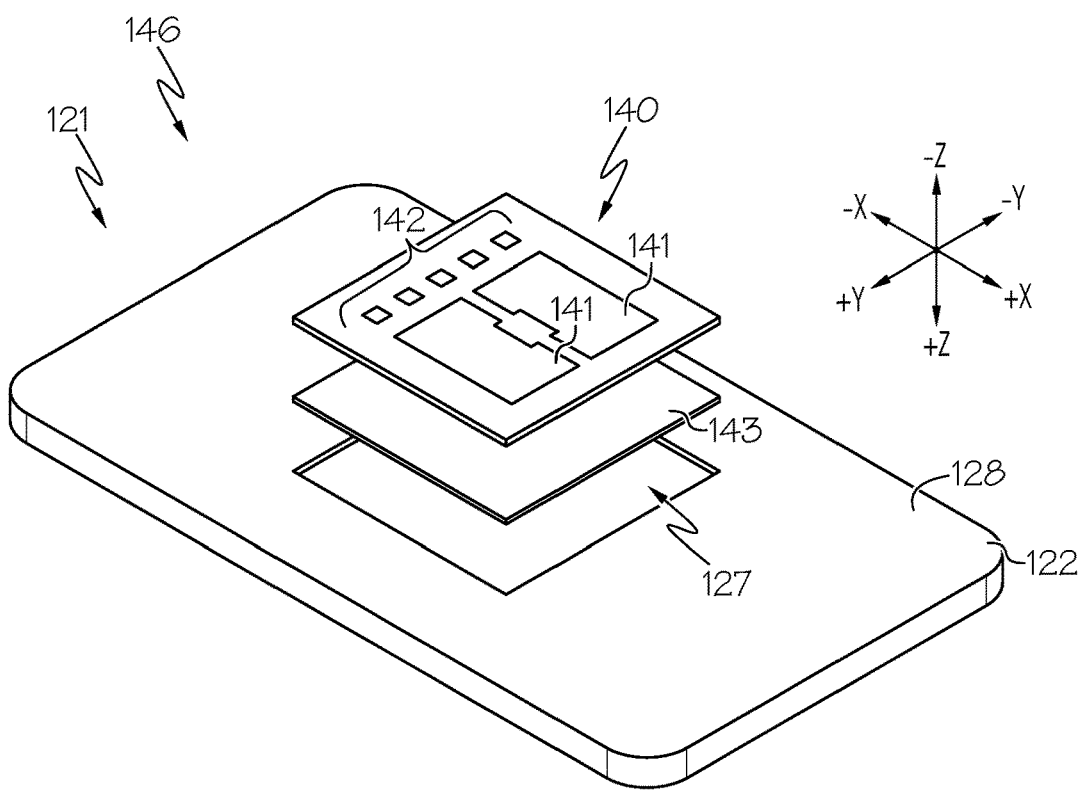
FIG. 4 schematically depicts an exploded perspective view of a power electronics device assembly including a substrate and a power electronics device, according to one or more embodiments described and illustrated herein.
Figure 5:
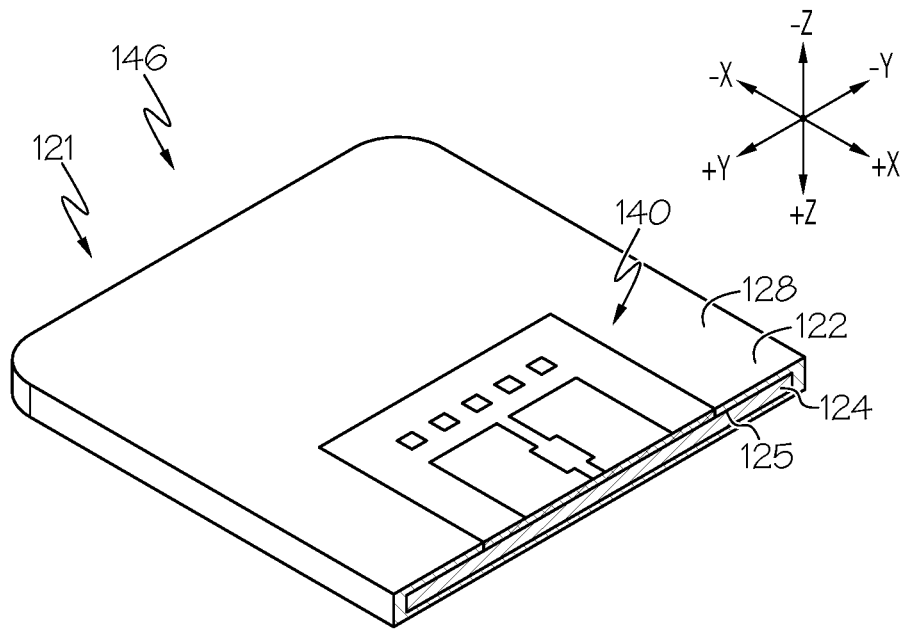
FIG. 5 schematically depicts a cross-section view of the power electronics device assembly of FIG. 4, according to one or more embodiments described and illustrated herein.

Referring now to FIGS. 4 and 5 an exploded bottom perspective view and an assembled cross-sectional view, respectively, of an example substrate 121 is shown. The substrate 121 includes a plurality of stacked layers. Particularly, the substrate 121 illustrated in FIGS. 4 and 5 includes a metal layer 122 and a graphite layer 124 embedded within the metal layer 122. The metal layer 122 includes an inner surface 125 and an outer surface 128 opposite the inner surface 125. In embodiments, the metal layer 122 includes a first metal layer and a second metal layer with the graphite layer 124 positioned between the first metal layer and the second metal layer. The metal layer 122 includes a recess 127 disposed in the outer surface 128 of the metal layer 122. The recess 127 is dimensioned to receive a power electronics device 140. As described in more detail below, the metal layer 122 provides an electrically conductive surface to which electrodes on a bottom surface of the power electronics device 140 are connected (e.g., via a direct connection and/or via electrically connective vias). It should be appreciated that the various layers of the substrate 121 depicted in FIGS. 4 and 5 are merely illustrative. That is, for example, the substrate 121 may include a plurality of graphite layers and/or other layers disposed between metal layers in some embodiments. It should be appreciated that the substrate 121 is a flipped substrate 121 such that, when positioned on the cold plate 102, and described in more detail herein, the power electronics device 140 faces a direction of the cold plate 102 (i.e., the −z direction of the coordinate axes depicted in the drawings) rather than an opposite direction (i.e., the +z direction of the coordinate axes).

It is noted that the substrate 121 in the embodiment of FIGS. 4 and 5 includes the graphite layer 124 embedded within the metal layer 122 to provide a substrate 121 that is symmetrical along a z-axis of the coordinate axes depicted in FIGS. 4 and 5. The symmetrical nature of the substrate 121 balances forces on the substrate 121 during the high-temperature bonding process. Because the metal layer 122 and the graphite layer 124 have different coefficients of thermal expansion, it may be desirable to have a symmetrical substrate stack to balance the thermally induced stresses during the bonding process.

The metal layer 122 may be made of any suitable metal or alloy. Copper and aluminum may be used as the metal layer 122 as non-limiting examples. The metal layer 122 of the substrate 121 has a recess 127 formed in the outer surface 128 thereof. The recess 127 may be formed by chemical etching, for example. The recess 127 has a size and shape to accept the power electronics device 140. The outer surface 128 may generally be a second major face or surface of the metal layer 122 that is opposite the inner surface 125 (which is configured as a first major face or surface of the metal layer 122). That is, the metal layer 122 may be a planar layer whereby the inner surface 125 faces the graphite layer 124 and the opposite outer surface 128 faces the power electronics device 140 and the circuit board assembly 106 (FIG. 1).

Figure 12:
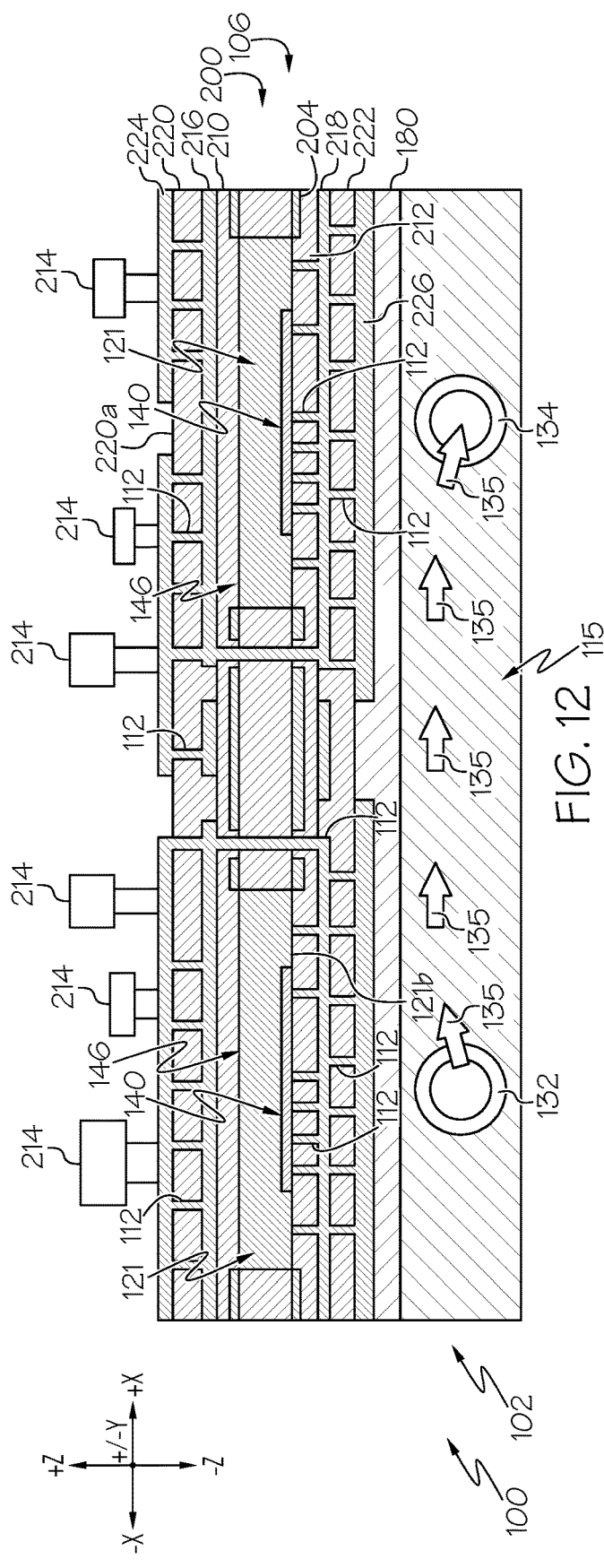
FIG. 12 schematically depicts a cross-sectional view of the power electronic assembly of FIG. 1, according to one or more embodiments described and illustrated herein.

The graphite layer 124 depicted in the embodiment of FIG. 5 is provided to encourage heat spreading both across the substrate 121 as well as toward the cold plate 102 (see, e.g., FIG. 12). The crystalline structure of graphite provides the graphite with high thermal conductivity, making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the substrate 121 is designed to be rectangular in shape such that its length dimension is greater than its width dimension. Referring to FIG. 5, the graphite layer 124 has high thermal conductivity along the x-axis and the z-axis of the coordinate axes depicted in FIG. 5. Thus, the substrate 121 is designed such that its dimension along the x-axis is larger than its dimension along the y-axis. Heat flux will travel along the x-axis and z-axis. As described in more detail below, heat flux is moved by the substrate 121 along the x-axis toward the cold plate 102. Heat flux will also travel along the z-axis toward the cold plate 102.

Referring again to FIG. 4, an exploded view of a power electronics device assembly 146 is depicted including the substrate 121 and the power electronics device 140. FIG. 4 depicts the power electronics device 140 and a bonding layer 143 with respect to the recess 127 of the substrate 121. The bonding layer 143 may be a solder layer, for example. As another example, the bonding layer 143 may be a transient liquid phase bonding layer 143. The power electronics device 140 includes a plurality of large electrodes 141 and a plurality of small electrodes 142 on an outer-facing surface. The large electrodes 141 may be power electrodes, while the small electrodes 142 may be signal electrodes. It is noted that, although not visible in FIG. 4, the power electronics device 140 further includes one or more electrodes on an opposite inward-facing surface. The one or more electrodes on the inward-facing surface of the power electronics device 140 are electrically connected to the metal layer 122 by placement of the power electronics device 140 into the recess 127. Thus, electrical connection to the electrodes on the inward-facing surface of the power electronics device 140 may be made by way of the metal layer 122.

As stated above, the substrate substrate 121 is a mounting substrate to which the power electronics device 140 is bonded. The substrate 121 provides an electrically conductive surface area to make connections to electrodes on the on the inward-facing surface of the power electronics device 140. The substrate 121 further provides heat spreading functionality as well as electrical isolation.

Figure 6:
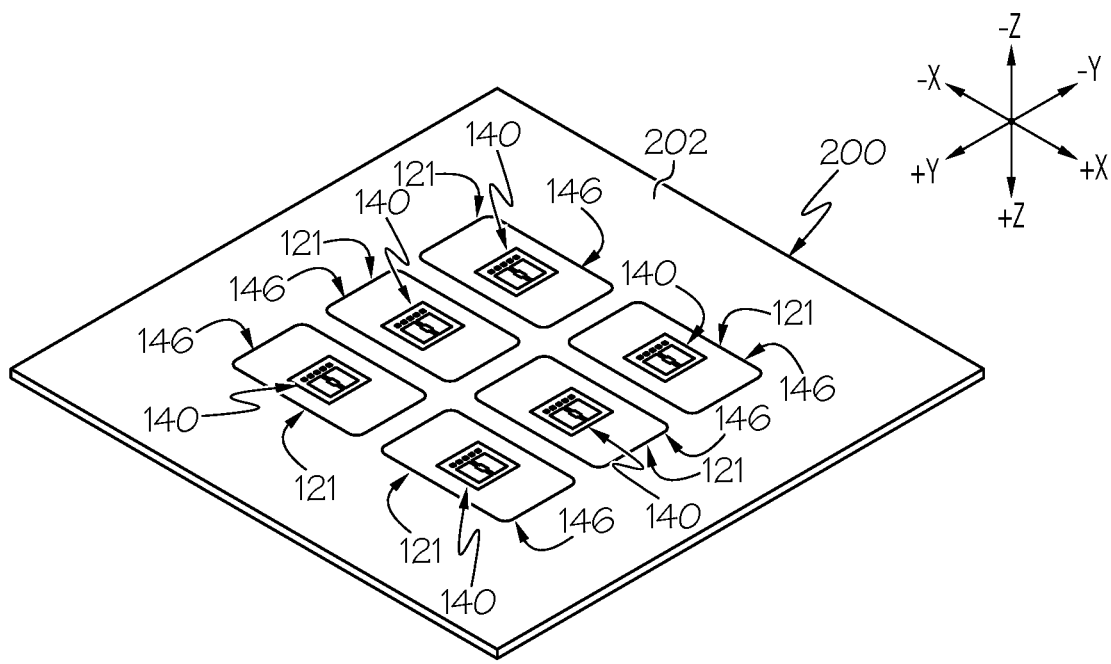
FIG. 6 schematically depicts a partial perspective view of a laminate panel including a plurality of power electronics device assemblies of FIG. 5, according to one or more embodiments described and illustrated herein.

Referring now to FIG. 6, a bottom perspective view of a laminate panel 200 is shown including one or more power electronics device assemblies 146 surrounded by a laminate material 202. The laminate panel 200 is to be provided on the first electrically insulating layer 180 opposite the cold plate 102 (FIG. 3). In embodiments, the laminate material 202 includes FR-4, however, alternative materials are within the scope of the present disclosure. As shown, a total of six power electronics device assemblies 146 are provided and bonded to the cold plate 102 via the first electrically insulating layer 180 and the laminate material 202 in two rows of three. However, it should be understood that any number of power electronics device assemblies 146 may be utilized depending on the application.

Figure 7:
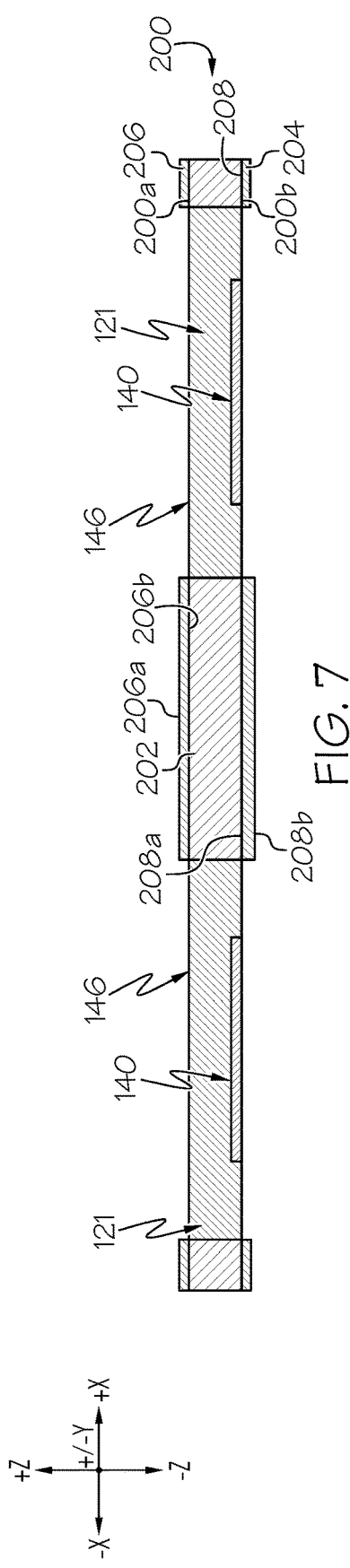
FIG. 7 schematically depicts a cross-sectional view of a partially formed circuit board assembly including the laminate panel of FIG. 6 provided between an upper conductive layer and a lower conductive layer, according to one or more embodiments described and illustrated herein.

Referring now to FIGS. 7-11, individual steps of forming the circuit board assembly 106 is depicted. Specifically, with reference to FIG. 7, a cross-sectional view of the laminate panel 200 is shown including an upper conductive layer 206 and a lower conductive layer 208 defining a core layer 204. The upper conductive layer 206 provided at an upper surface 200a of the laminate panel 200 and a lower conductive layer 208 provided at an opposite lower surface 200b of the laminate panel 200. The upper conductive layer 206 has an upper surface 206a and a lower surface 206b opposite the upper surface 206a of the upper conductive layer 206. Similarly, the lower conductive layer 208 has an upper surface 208a and a lower surface 208b opposite the upper surface 208a of the lower core conductive layer 208. As shown in FIG. 7 and discussed herein, holes are formed in the core layer 204 and the power electronics device assemblies 146 are inserted into respective holes. Accordingly, the power electronics devices 140 are exposed through the lower conductive layer 208.

Figure 8:
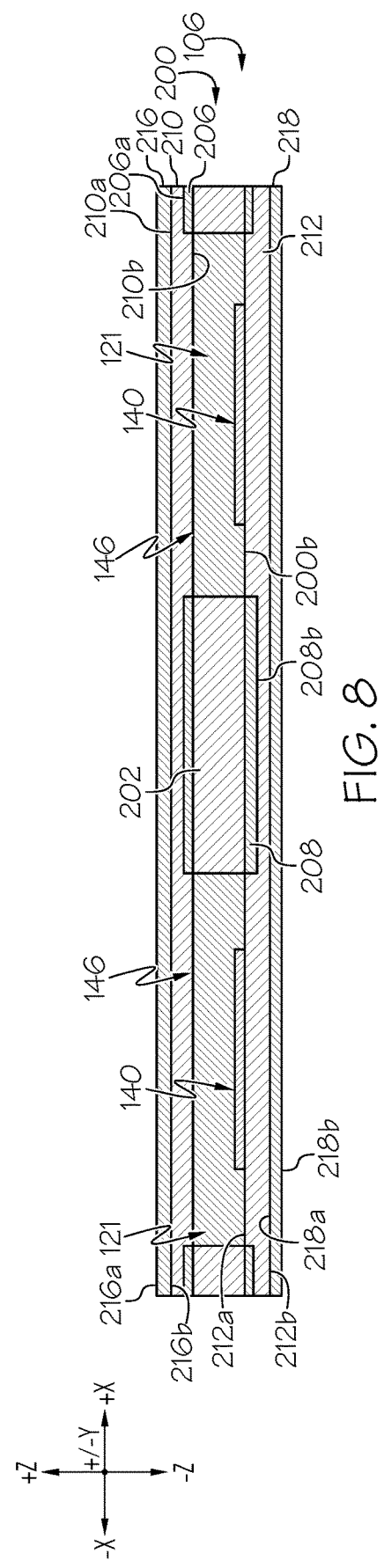
FIG. 8 schematically depicts a cross-sectional view of the partially formed circuit board assembly of FIG. 7 provided between a first electrically conductive logic layer and a first electrically conductive power layer, according to one or more embodiments described and illustrated herein.

Referring now to FIG. 8, a second electrically insulating layer 210 is provided on the upper surface 206a of the upper conductive layer 206, and a third electrically insulating layer 212 is provided on the lower surface 208b of the lower conductive layer 208. The second electrically insulating layer 210 has an upper surface 210a and a lower surface 210b opposite the upper surface 210a of the second electrically insulating layer 210. Similarly, the third electrically insulating layer 212 has an upper surface 212a and a lower surface 212b opposite the upper surface 212a of the third electrically insulating layer 212. As shown, the laminate panel 200 is provided between the second electrically insulating layer 210 and the third electrically insulating layer 212. It should be appreciated that the second electrically insulating layer 210 and the third electrically insulating layer 212 may include the same material as the first electrically insulating layer 180 (FIG. 3). Referring still to FIG. 8, a first electrically conductive logic layer 216 is provided on the upper surface 210a of the second electrically insulating layer 210 and a first electrically conductive power layer 218 is provided on the lower surface 212b of the third electrically insulating layer 212. In embodiments, the first electrically conductive logic layer 216 and the first electrically conductive power layer 218 are copper layers. The first electrically conductive logic layer 216 has an upper surface 216a and a lower surface 216b opposite the upper surface 216a of the first electrically conductive logic layer 216. Similarly, the first electrically conductive power layer 218 has an upper surface 218a and a lower surface 218b opposite the upper surface 218a of the first electrically conductive power layer 218.

Figure 9:
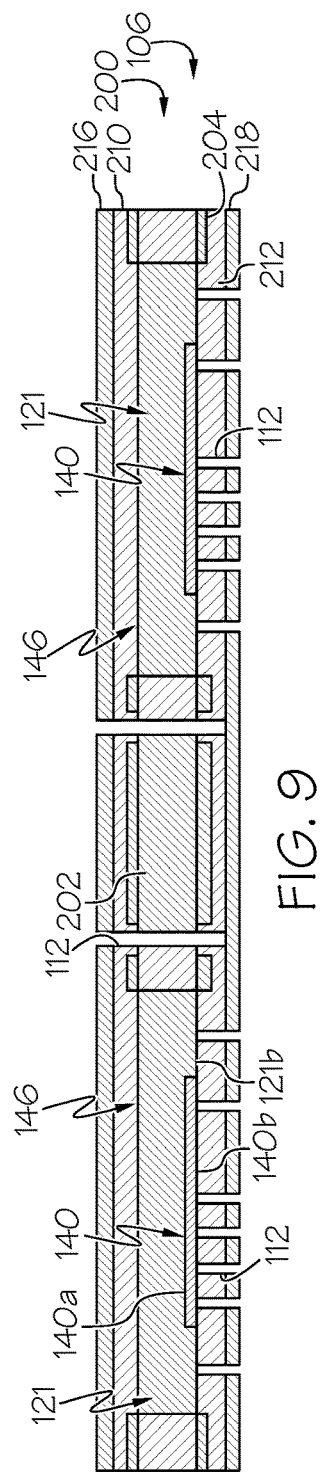
FIG. 9 schematically depicts a cross-sectional view of the partially formed circuit board assembly of FIG. 8 having vias formed therethrough, according to one or more embodiments described and illustrated herein.

Referring to FIG. 9, vias 112 (both electrically conducting vias and thermal vias) are formed to extend between any combination of the power electronics devices 140 of the power electronics device assemblies 146, the first electrically conductive logic layer 216, and the first electrically conductive power layer 218. For example, vias 112 are shown extending between the first electrically conductive logic layer 216 and the first electrically conductive power layer 218. Additionally, vias 112 are shown extending between the first electrically conductive power layer 218 and a bottom surface 140b of the power electronics device 140 so as to electrically couple the first electrically conductive logic layer 216 and the first electrically conductive power layer 218 to the bottom surface 140b of the power electronics device 140. Additionally, vias 112 are shown extending between the first electrically conductive power layer 218 and a bottom surface 121b of the substrate 121 so as to electrically couple the first electrically conductive logic layer 216 and the first electrically conductive power layer 218 to a top surface 140a of the power electronics device 140. The vias 112 may be formed in any suitable manner such as, for example, laser drilling. It should be appreciated that the scope of the present disclosure is not limited to the particular configuration of vias 112 depicted in FIG. 9 and other configurations are contemplated based on the specific needs of the circuit board assembly 106.

The vias 112 may provide drive signals to the power electronics devices 140, as well as provide a current path for switching current. It is noted that, in some embodiments, some of the vias 112 may be configured as thermal vias that do not conduct drive signals or switching current. In addition, the substrate arrangement allows for flux movement from the power electronics device 140 to the cold plate 102 (FIG. 12) via the substrate 121, as described herein. In this way, heat flux is optimally directed away from the power electronics devices 140 and toward the cold plate 102 via the substrate 121.

Figure 10:
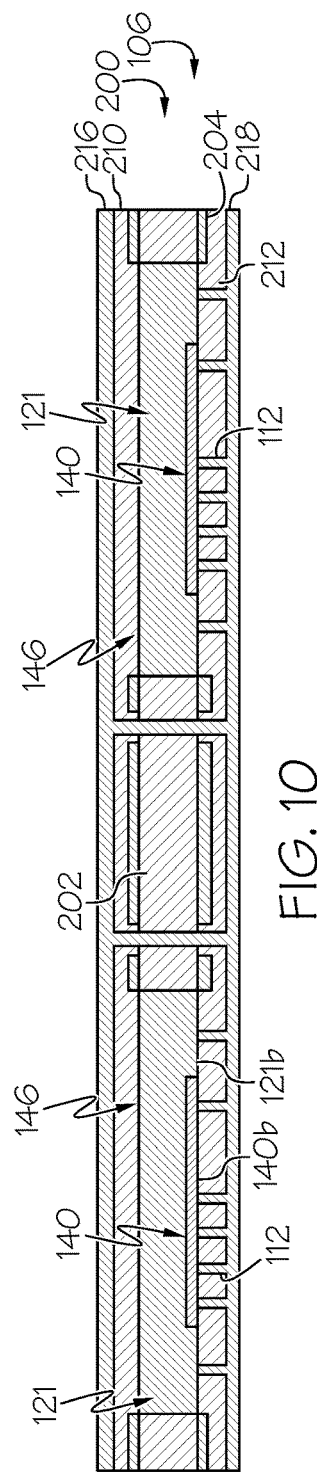
FIG. 10 schematically depicts a cross-sectional view of the partially formed circuit board assembly of FIG. 9 with the vias being filled, according to one or more embodiments described and illustrated herein.

Referring now to FIG. 10, the vias 112 are filled with copper by electroplating to form electrical connections between each power electronics device assembly 146, the first electrically conductive logic layer 216, and the first electrically conductive power layer 218. However, it should be appreciated that the vias 112 may be filled in any other suitable manner other than electroplating.

Figure 11:
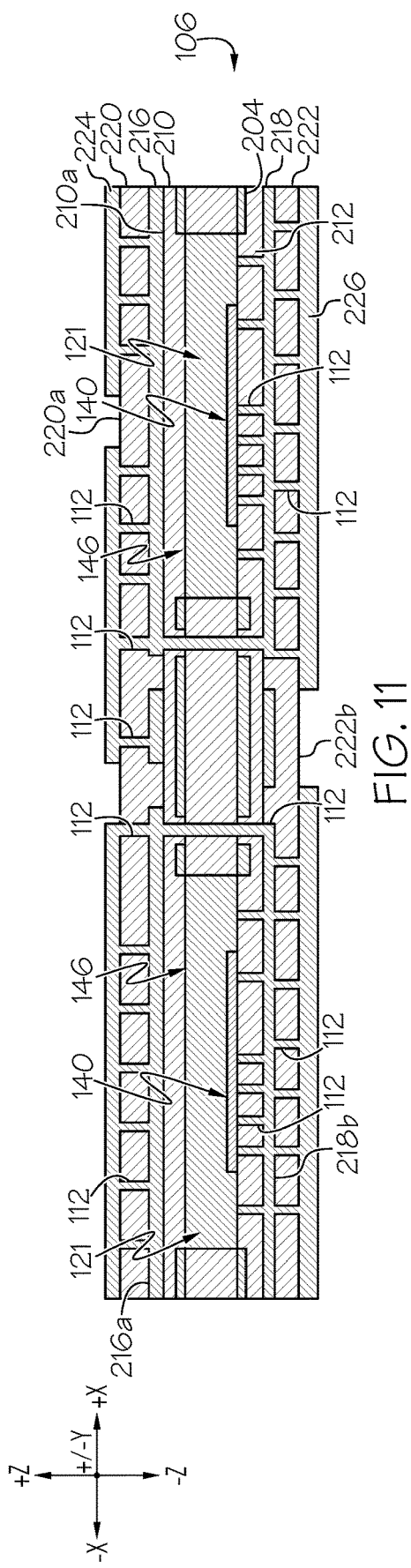
FIG. 11 schematically depicts a cross-sectional view of the circuit board assembly of FIG. 10 provided between a second electrically conductive logic layer and a second electrically conductive power layer forming the circuit board assembly of FIG. 1, according to one or more embodiments described and illustrated herein.

Referring now to FIG. 11, the first electrically conductive logic layer 216 and the first electrically conductive power layer 218 are etched to a specified pattern to guide current. Once the first electrically conductive logic layer 216 and the first electrically conductive power layer 218 are etched, the steps described above with respect to FIGS. 8-10 are repeated such that a fourth electrically insulating layer 220 is provided on the upper surface 216a of the first electrically conductive logic layer 216, and a fifth electrically insulating layer 222 is provided on the lower surface 218b of the first electrically conductive power layer 218.

Subsequently, a second electrically conductive logic layer 224 is provided on an upper surface 220a of the fourth electrically insulating layer 220 opposite the first electrically conductive logic layer 216, and a second electrically conductive power layer 226 is provided on a lower surface 222b of the fifth electrically insulating layer 222 opposite the first electrically conductive power layer 218. As such, the first electrically conductive logic layer 216 and the second electrically conductive logic layer 224 are provided on an upper side of the power electronics device assembly 146, and the first electrically conductive power layer 218 and the second electrically conductive power layer 226 are provided at a lower side of the power electronics device assembly 146 opposite the upper side. Stated another way, the power electronics device assembly 146 separates the first electrically conductive logic layer 216 and the second electrically conductive logic layer 224 from the first electrically conductive power layer 218 and the second electrically conductive power layer 226. Therefore, it should be appreciated that each electrically conductive logic layer 216, 224 is on one side of the power electronics device assembly 146 and each electrically conductive power layer 218, 226 is on an opposite side of the power electronics device assembly 146. Moreover, no electrically conductive logic layer 216, 224 is adjacent any electrically conductive power layer 218, 226, and vice versa.

Additional vias 112 are then formed through the second electrically conductive logic layer 224 to the first electrically conductive logic layer 216, as well as additional vias 112 formed through the second electrically conductive power layer 226 to the first electrically conductive power layer 218. Thereafter, similar to that discussed herein with respect to FIG. 10, the vias 112 are filled with copper by electroplating to form electrical connections between the first electrically conductive logic layer 216 and the second electrically conductive logic layer 224, as well as the first electrically conductive power layer 218 and the second electrically conductive power layer 226. However, it should be appreciated that the vias 112 may be filled in any other suitable manner other than electroplating.

Referring still to FIG. 11, the second electrically conductive logic layer 224 and the second electrically conductive power layer 226 are similarly etched to a specified pattern to guide current. It should be appreciated that the second electrically conductive logic layer 224 may be laminated to the first electrically conductive logic layer 216, and the second electrically conductive power layer 226 may be laminated to the first electrically conductive power layer 218 in a high-temperature, high pressure chamber. During this lamination step, material from the second electrically insulating layer 210 and the fourth electrically insulating layer 220 fills gaps defined by the etching of the first electrically conductive logic layer 216 and the second electrically conductive logic layer 224. Similarly, material from the third electrically insulating layer 212 and the fifth electrically insulating layer 222 fills gaps defined by the etching of the first electrically conductive power layer 218 and the second electrically conductive power layer 226.

It should be appreciated that the circuit board assembly 106 may include any number of electrically insulating layers and electrically conductive layers other than that depicted herein. However, in embodiments, the circuit board assembly 106 includes the same number of electrically conductive logic layers as the number of electrically conductive power layers. In addition, each of the electrically conductive logic layers are provided on one side of the power electronics device assembly 146 and each of the electrically conductive power layers are provided on an opposite side of the power electronics device assembly 146. In doing so, the steps described herein with respect to FIGS. 8-11 may be repeated with each additional layer being laminated to a previous layer.

Referring now to FIG. 12, a cross-sectional view of the power electronics assembly 100 is depicted including the circuit board assembly 106 shown mounted onto the cold plate 102 via the first electrically insulating layer 180. It should be appreciated that no electrically conductive logic layer is provided between the laminate panel 200 and the cold plate 102. Rather, only the electrically conductive power layers 218, 226 are provided between the laminate panel 200 and the cold plate 102, and the electrically conductive logic layers 216, 224 are located on an opposite side of the laminate panel 200. Additionally, as each electrically conductive power layer 218, 226 is provided between the laminate panel 200 and the cold plate 102, no electrically conductive power layer 218, 226 is provided on a side of the laminate panel 200 opposite the cold plate 102. As such, each electrically conductive logic layer 216, 224 is separated from each electrically conductive power layer 218, 226 by the laminate panel 200.

The benefit of separating the electrically conductive logic layers 216, 224 from the electrically conductive power layers 218, 226 is that the number of total layers of the circuit board assembly 106 may be reduced by not increasing a total footprint of the circuit board assembly 106. Additionally, this reduces the total thermal resistance between the power electronics devices 140 and the cold plate 102 as the electrically conductive power layers 218, 226 provides decreased thermal resistance as compared to the electrically conductive logic layers 216, 224. This also provided improved cooling performance to the circuit board assembly 106. Further, with the electrically conductive power layers 218, 226 provided on the same side of the laminate panel 200, a loop inductance is reduced, thus reducing loss and increasing efficiency of the circuit board assembly 106.

As shown, cooling fluid (depicted as moving arrows 135) from a reservoir (not shown) flows into the fluid chamber 115 through the fluid inlet 132 and out of the fluid chamber 115 through the fluid outlet 134 as warmed cooling fluid, where it is returned to the reservoir, such as after flowing through a heat exchanger (not shown) to remove heat from the cooling fluid 135. Although not shown, an array of fins may be provided in the fluid chamber 115 to provide additional surface area for heat transfer to the cooling fluid 135.

Referring still to FIG. 12, one or more surface mounted electronics 214 may be mounted to the second electrically conductive logic layer 224. As described herein, the surface mounted electronics 214 may include, for example, transistors, resistors, capacitors, and the like. Accordingly, it should be appreciated that the circuit board assembly 106 includes at least the laminate panel 200, including the plurality of power electronics device assemblies 146, as well as the first electrically conductive logic layer 216, the second electrically conductive logic layer 224, the first electrically conductive power layer 218, the second electrically conductive power layer 226, and the surface mounted electronics 214.

From the above, it is to be appreciated that defined herein are power electronics assemblies and methods for fabricating the same. Specifically, the power electronics assemblies disclosed herein include a circuit board assembly including a plurality of electrically conductive logic layers, a plurality of electrically conductive power layers, and a laminate panel provided between the plurality of electrically conductive logic layers and the plurality of electrically conductive logic layers. The laminate panel includes a power electronics device assembly including a substrate and a power electronics device. The substrate includes a graphite layer and a metal layer encasing the graphite layer. A recess is formed in an outer surface of the metal layer. The power electronics device is bonded within the recess of the outer surface of the substrate. Each electrically conductive logic layer is provided at a first surface of the laminate panel, and each electrically conductive power layer is provided at a second surface of the laminate panel opposite the first surface of the laminate panel.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A power electronics assembly comprising:
   a circuit board assembly comprising:
      a plurality of electrically conductive logic layers;
      a plurality of electrically conductive power layers; and
      a laminate panel provided between the plurality of electrically conductive logic layers and the plurality of electrically conductive power layers, the laminate panel comprising:
         a power electronics device assembly comprising:
            a substrate comprising:
               a graphite layer; and
               a metal layer encasing the graphite layer, a recess formed in an outer surface of the metal layer; and
            a power electronics device bonded within the recess of the outer surface of the substrate,
      wherein each electrically conductive logic layer is provided at a first surface of the laminate panel, and each electrically conductive power layer is provided at a second surface of the laminate panel opposite the first surface of the laminate panel.

2. The power electronics assembly of claim 1, wherein the laminate panel comprises:
   a laminate material; and
   a plurality of power electronics device assemblies embedded within the laminate material.

3. The power electronics assembly of claim 2, wherein the laminate material comprises FR-4.

4. The power electronics assembly of claim 1, wherein the circuit board assembly further comprises a plurality of vias extending through the plurality of electrically conductive logic layers and the plurality of electrically conductive power layers to thermally couple the power electronics device to the plurality of electrically conductive logic layers and the plurality of electrically conductive power layers.

5. The power electronics assembly of claim 1, wherein the substrate has a length that is greater than a width of the substrate.

6. The power electronics assembly of claim 1, further comprising a cold plate, wherein the circuit board assembly is bonded to a surface of the cold plate by a first electrically insulating layer.

7. The power electronics assembly of claim 6, wherein the power electronics device of the power electronics device assembly faces a direction of the cold plate.

8. The power electronics assembly of claim 6, wherein each of the plurality of electrically conductive power layers are provided between the laminate panel and the cold plate.

9. The power electronics assembly of claim 6, wherein no electrically conductive logic layer is provided between the power electronics device assembly and the cold plate.

10. The power electronics assembly of claim 6, wherein no electrically conductive power layer is provided on a side of the power electronics device assembly opposite the cold plate.

11. A power electronics assembly comprising:
    a circuit board assembly comprising:
       a plurality of electrically conductive logic layers;
       a plurality of electrically conductive power layers; and
       a laminate panel provided between the plurality of electrically conductive logic layers and the plurality of electrically conductive power layers, the laminate panel comprising:
          a power electronics device assembly comprising:
             a substrate comprising:
                a graphite layer; and
                a metal layer encasing the graphite layer, a recess formed in an outer surface of the metal layer; and
             a power electronics device bonded within the recess of the outer surface of the substrate, a plurality of vias thermally coupling each of the power electronics devices to the plurality of electrically conductive logic layers and the plurality of electrically conductive power layers; and
       a cold plate, the circuit board assembly mounted to a surface of the cold plate,
    wherein each electrically conductive logic layer is provided at a first surface of the laminate panel, and each electrically conductive power layer is provided at a second surface of the laminate panel opposite the first surface of the laminate panel.

12. The power electronics assembly of claim 11, wherein:
    the laminate panel comprises a laminate material; and
    the plurality of power electronics device assemblies are embedded within the laminate material.

13. The power electronics assembly of claim 11, wherein the power electronics device of the power electronics device assembly faces a direction of the cold plate.

14. The power electronics assembly of claim 11, wherein each of the plurality of electrically conductive power layers are provided between the laminate panel and the cold plate.

15. The power electronics assembly of claim 11, wherein no electrically conductive logic layer is provided between the power electronics device assembly and the cold plate.

16. The power electronics assembly of claim 11, wherein no electrically conductive power layer is provided on a side of the power electronics device assembly opposite the cold plate.

17. A method comprising:
    providing a first electrically insulating layer on a first surface of a cold plate;
    providing a circuit board assembly on the first electrically insulating layer opposite the cold plate, the circuit board assembly comprising:

a plurality of electrically conductive logic layers;
a plurality of electrically conductive power layers; and
a laminate panel provided between the plurality of electrically conductive logic layers and the plurality of electrically conductive power layers, the laminate panel comprising:
a power electronics device assembly comprising:
a substrate comprising:
a graphite layer; and
a metal layer encasing the graphite layer, a recess formed in an outer surface of the metal layer; and
a power electronics device bonded within the recess of the outer surface of the substrate,
wherein each electrically conductive logic layer is provided at a first surface of the laminate panel, and each electrically conductive power layer is provided at a second surface of the laminate panel opposite the first surface of the laminate panel.

18. The method of claim 17, wherein the power electronics device of the power electronics device assembly faces a direction of the cold plate.

19. The method of claim 17, wherein no electrically conductive logic layer is provided between the power electronics device assembly and the cold plate.

20. The power electronics assembly of claim 17, wherein no electrically conductive power layer is provided on a side of the power electronics device assembly opposite the cold plate.

* * * * *

UNITED STATES PATENT AND TRADEMARK OFFICE
CERTIFICATE OF CORRECTION

| | |
|---|---|
| PATENT NO. | : 12,284,792 B2 |
| APPLICATION NO. | : 18/173231 |
| DATED | : April 22, 2025 |
| INVENTOR(S) | : Feng Zhou |

Page 1 of 1

It is certified that error appears in the above-identified patent and that said Letters Patent is hereby corrected as shown below:

On the Title Page

Column 2, item (57), abstract, Line(s) 6, delete "logic" and insert --power--, therefor.

In the Specification

In Column 6, Line(s) 63, delete "substrate substrate" and insert --substrate--, therefor.

In Column 6, Line(s) 66 & 67, delete "on the on the" and insert --on the--, therefor.

In Column 9, Line(s) 13, after "adjacent", insert --to--.

Signed and Sealed this
Third Day of June, 2025

Coke Morgan Stewart
*Acting Director of the United States Patent and Trademark Office*